US006288345B1

United States Patent
Akale et al.

(10) Patent No.: US 6,288,345 B1
(45) Date of Patent: Sep. 11, 2001

(54) COMPACT Z-AXIS DC AND CONTROL SIGNALS ROUTING SUBSTRATE

(75) Inventors: Tamrat Akale, Torrance; Robert C. Allison, Rancho Palos Verdes; Lawrence Dalconzo, Los Angeles; James M. Harris, Encinitas, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/532,264

(22) Filed: Mar. 22, 2000

(51) Int. Cl.[7] ............................... H05K 1/03; H05K 1/11; H05K 1/14
(52) U.S. Cl. .................. 174/255; 174/256; 174/260; 361/760; 361/792; 361/794; 361/800
(58) Field of Search .................................. 174/255, 253, 174/256, 257, 258, 259, 261, 260, 52.4, 726; 361/792, 735, 738, 739, 746, 767, 772, 777, 793, 794, 795, 803, 808, 816, 760, 750, 751, 762; 257/666, 691, 692, 779; 439/65, 74

(56) References Cited

U.S. PATENT DOCUMENTS

| | | | | |
|---|---|---|---|---|
| 3,760,091 | * | 9/1973 | Cannizzaro et al. | 174/256 |
| 4,812,792 | * | 3/1989 | Leibowitz | 333/238 |
| 5,471,368 | * | 11/1995 | Downie et al. | 361/760 |
| 5,600,101 | * | 2/1997 | Sakai | 174/261 |
| 5,635,669 | * | 6/1997 | Kubota et al. | 174/52.1 |
| 5,847,930 | * | 12/1998 | Kazle | 361/736 |
| 6,175,088 | * | 9/2000 | Saccocio | 174/262 |
| 6,212,078 | * | 4/2000 | Hunt et al. | 361/793 |

* cited by examiner

Primary Examiner—Jeffrey Gaffin
Assistant Examiner—Ishwar B. Patel
(74) Attorney, Agent, or Firm—Leonard A. Alkov; Glenn H. Lenzen, Jr.

(57) ABSTRACT

A compact thick film substrate for filtering, shielding, and routing multiple lines of dc and control signals between isolated ports of a microwave integrated circuit. The substrate circuit includes a dielectric substrate having upper and lower substrate surfaces and first and second side surfaces. A first ground plane layer is formed on the upper substrate surface. A first thick film assembly is formed on the first ground plane layer, and includes a first thin dielectric layer, a first set of thin conductive traces formed on the thin dielectric layer and onto the first and second side surfaces terminating in a first set of edge trace pads formed on the first side surface and a second set of edge trace pads formed on the second side surface, a second thin dielectric layer formed over the upper substrate surface covering the first set of traces such that the traces are sandwiched and shielded between adjacent first surfaces of the first and second dielectric layers, and a second ground plane formed on a second surface of the second dielectric layer. The first and second sets of trace pads are exposed for connection to adjacent circuitry. A second thick film assembly is formed on the lower surface of the substrate to provide third and fourth sets of trace pads for connection to the adjacent circuitry.

11 Claims, 4 Drawing Sheets

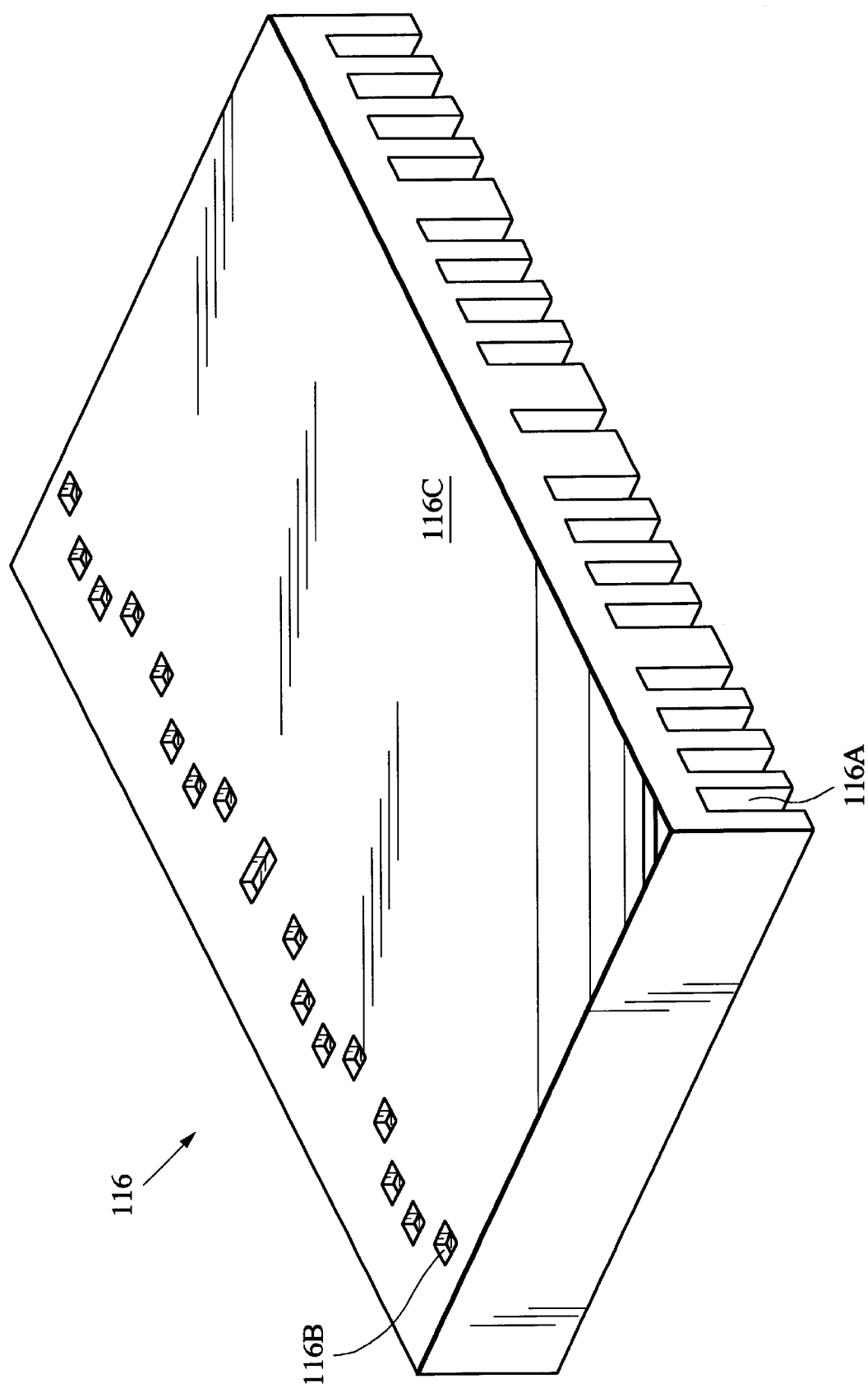

COMPACT Z-AXIS DC AND CONTROL SIGNALS ROUTING SUBSTRATE

TECHNICAL FIELD OF THE INVENTION

This invention relates to microwave integrated circuits, and more particularly to techniques for filtering, shielding and routing dc and control signals in such devices.

BACKGROUND OF THE INVENTION

Most microwave integrated circuits use individually manufactured pins as part of their signal routing. These pins have a built in capacitance to ground for filtering purpose, with a tolerance variation of ±50%. These variations contribute to performance degradation.

Furthermore, these pins come as individual packages. It takes a considerable amount of time and effort in the installation processes, which adds cost.

SUMMARY OF THE INVENTION

An aspect of this invention is a single compact thick film substrate for filtering, shielding, and routing multiple lines of dc and control signals between isolated ports of a microwave integrated circuit (MIC). This reduces multiple number of processes and parts to a single process and a single part. Z-axis dc routing is used so that signals are placed where they are needed, avoiding wire jumping of RF signal traces.

The substrate circuit includes a dielectric substrate having upper and lower substrate surfaces and first and second side surfaces. A first ground plane layer is formed on the upper substrate surface. A first thick film assembly is formed on the first ground plane layer, and includes a first thin dielectric layer, a first set of thin conductive traces formed on the thin dielectric layer and onto the first and second side surfaces terminating in a first set of edge trace pads formed on the first side surface and a second set of edge trace pads formed on the second side surface, a second thin dielectric layer formed over the upper substrate surface covering the first set of traces such that the traces are sandwiched and shielded between adjacent first surfaces of the first and second dielectric layers, and a second ground plane formed on a second surface of the second dielectric layer. The first and second sets of trace pads are exposed for connection to adjacent circuitry. A second thick film assembly can be formed on the lower surface of the substrate to provide third and fourth sets of trace pads for connection to the adjacent circuitry.

BRIEF DESCRIPTION OF THE DRAWING

These and other features and advantages of the present invention will become more apparent from the following detailed description of an exemplary embodiment thereof, as illustrated in the accompanying drawings, in which:

FIG. 6 is an isometric view of the rack structure used in the assembly of FIG. 2.

DETAILED DESCRIPTION OF THE PREFERRED EMBODIMENTS

Figure 1:
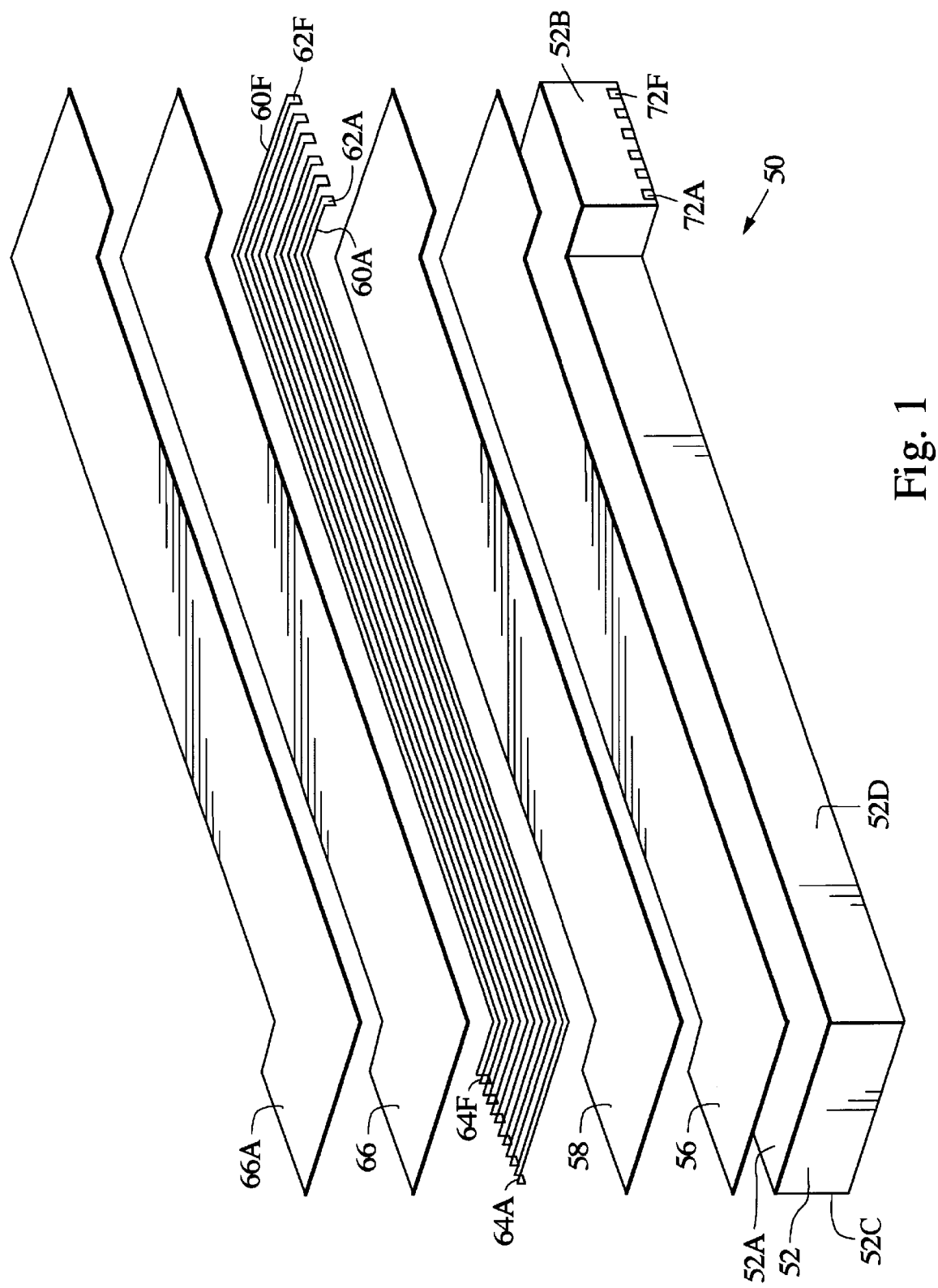
FIG. 1 is an isometric partially exploded view of a DC and control signal routing substrate accordance with the invention.

An exemplary embodiment of a DC and control signal routing substrate circuit 50 in accordance with the invention is shown in the partially exploded isometric view of FIG. 1. The circuit 50 includes a dielectric substrate 52, which in this embodiment is an alumina substrate, 0.05 inch thick. In FIG. 1, for clarity, only the circuit elements on the top surface of the substrate are shown in exploded view; it will be appreciated that identical circuit elements are formed on the bottom surface as well. In a first step, using well known thick film processes, gold is plated on both sides of the substrate for grounding, thereby providing ground plane layers, including layer 56 formed on top substrate surface 52A. The plating forming the gold layers is stopped short of the substrate edges by a small distance, e.g. 0.02 inch, so that the traces will not short.

The next step is to form by a thick film screen process a thin dielectric layer, e.g. 0.0015 inch thick, on top of each of the gold ground layers; for example dielectric layer 58 is formed on the gold layer 56. Such thick film screen processes are well known in the art. Exemplary dielectric materials suitable for the purpose are ESL 4206 and 4113, marketed by Electro Science Laboratories.

Once the dielectric layers are screened, a number of conductive dc and control signal traces are etched on the dielectric layers, on both opposed sides of the substrate, using a thin film etching process. Thin film etching processes suitable for the purpose are well known in the art. In this exemplary embodiment, the conductive traces are extended over the edges of the substrate 52 and onto the side surfaces of the substrate 52 to form trace pads for ease of interface. Thus, for example, traces 60A–60F are formed on dielectric layer 58 and include trace pads 62A–62F formed on substrate side surface 52B and trace pads 64A–64F formed on substrate side surface 52C. In an exemplary embodiment, the trace pads are about 0.01 inch by 0.01 inch, facilitating wire bond connections using wire bonding techniques. Another set of trace pads 72A–72F is formed on side surface 52B for the lower surface traces (not visible in FIG. 1).

Another layer of dielectric, e.g. 0.0015 inch thick, with the back side metalized, is screened on top of the traces. Thus, for example, dielectric layer 66 is formed on traces 60A–60F, and has a metal layer 66A formed on the upper surface of the dielectric, with the bottom surface of the dielectric on the traces. Upon completion of the process, the traces are effectively shielded by, and sandwiched between, the dielectric layers 58 and 66. The traces are embedded in, and form part of, a capacitive structure which includes the ground planes 56, 66A, the dielectric layers 58 and 66, and the conductor traces. Since the distance of the DC traces from the ground plane is very small, capacitance exists. The capacitance is a function of the trace area, distances and dielectric constants; the width and length of the traces coupled with the dielectric constant of the screened dielectric layers determine the capacitance values of each trace. Respective ones of the traces are intended to carry control signals and DC power. Capacitance helps to filter out some unwanted resonant signals.

Figure 2:
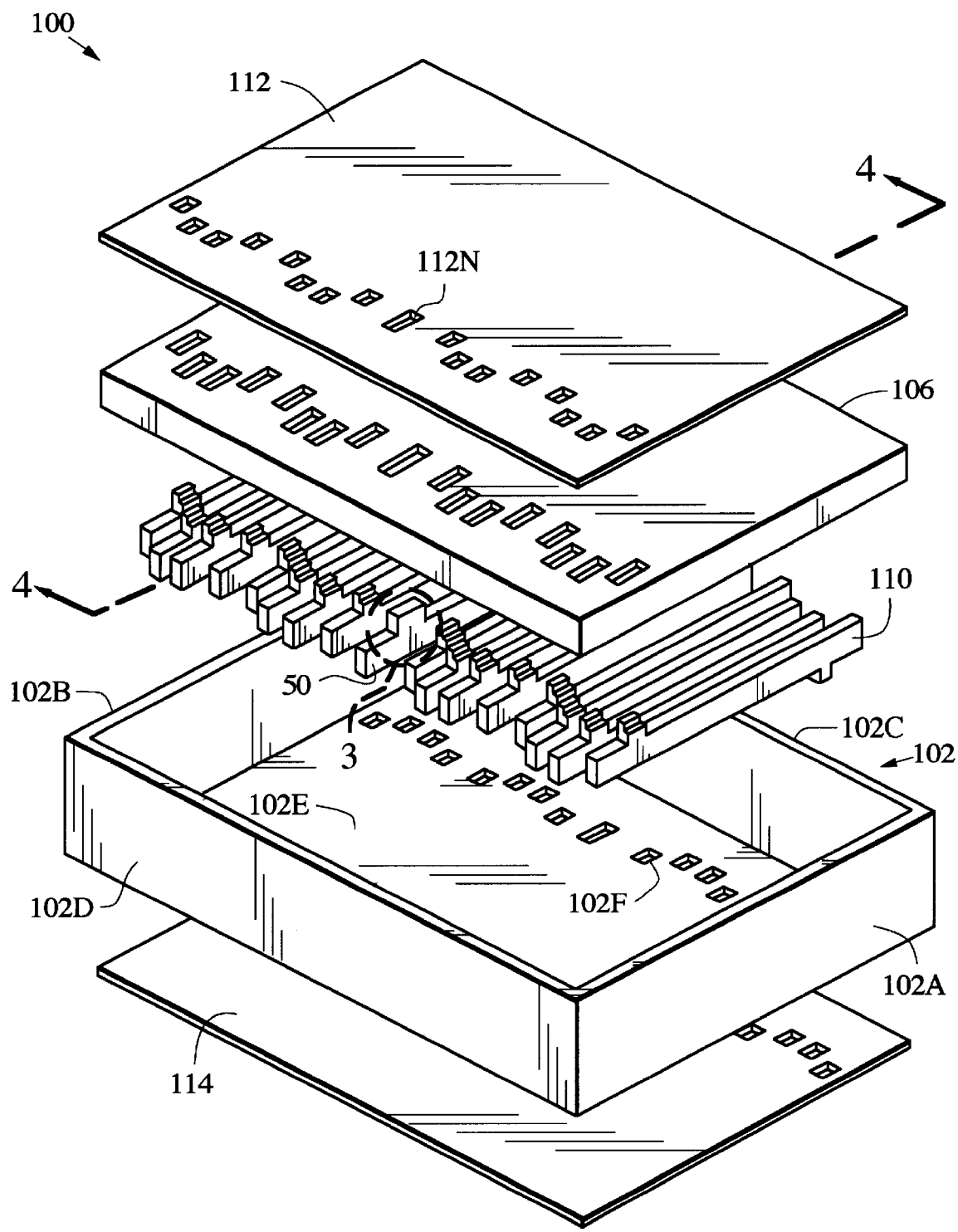
FIG. 2 is an exploded view of a microwave circuit assembly employing the substrate FIG. 1.

In the exemplary embodiment of FIG. 1, the substrate 52 has a dogleg-like shape, wherein surfaces 52B and 52C jut out from respective side surfaces 52D, 52E (not visible in FIG. 1). This shape facilitates use of the substrate in a circuit assembly 100, as shown in further detail in FIGS. 2–6. FIG. 2 shows in exploded isometric view a frame-like metal housing 102 comprising side walls 102A–102D, and floor 102E with openings 102F formed therein. A mounting rack 106 is fabricated of a metal material such as aluminum, and is shown in more detail in FIG. 6. The rack has formed therein a plurality of elongated slots 116A sized to receive corresponding circuits, including microwave filter circuits 110 and control signal and DC power carrying substrate circuit 50. The rack 116 has formed in its top surface 116C a plurality of rectangular openings 116B, each sized to receive therethrough a corresponding dog-leg end of a circuit 110 or 50. Similarly, the openings 102F are each sized to receive therethrough a corresponding dog-leg end of a circuit 110 or 50. The rack provides shielding between adjacent circuits in the respective slots, and supports the circuits in position within the housing 102.

Figure 3:
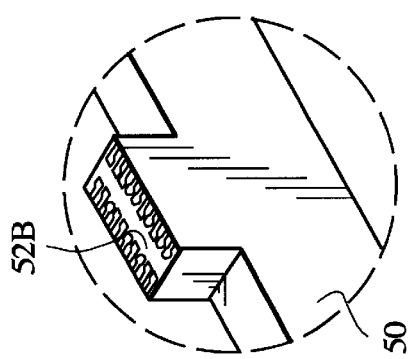
FIG. 3 is a partial isometric view of the substrate in the assembly of FIG. 2.

The assembly 100 further includes top and bottom planar dielectric circuit board substrates 112 and 114, fabricated of a material such as alumina. The substrates 112 and 114 in this exemplary embodiment have a thickness of 0.015 inch, and typically have conductive circuit traces and pads, and passive/active circuit components. The substrates have formed therein corresponding openings, e.g. openings 112N (FIG. 2) to receive therethrough corresponding ones of the dogleg connector portions of the circuits 50 and 110. FIG. 3 shows one connection end of the substrate 50, with the trace pads formed on an end surface thereof.

Figure 5:
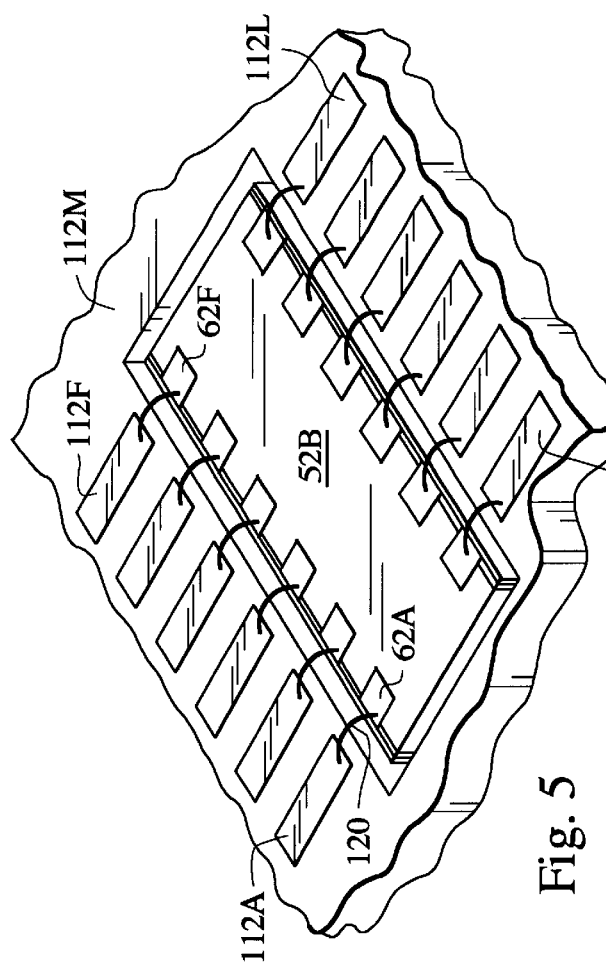
FIG. 5 is a close-up isometric view of a portion of the assembly of FIG. 2, showing illustrative connections between the microwave integrated circuit and the substrate.
Figure 4:
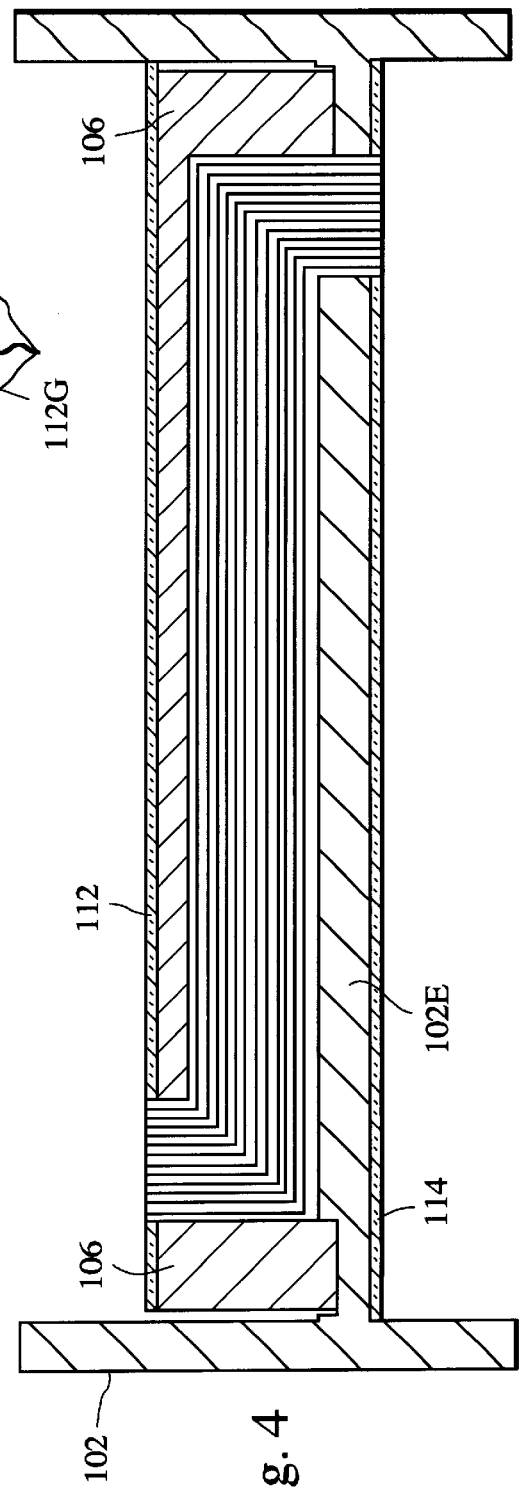
FIG. 4 is a cross-sectional view of the assembly of FIG. 2, taken along line 4—4 of FIG. 2.

The substrate 50 is vertically positioned in the assembly 100 such that the side surfaces 52B, 52C are respectively positioned for exposure at respective bottom and top locations through openings in the substrates 112, 114. The top dielectric layer 66 and conductive layer 66A are not shown for clarity in FIG. 4, to show the exemplary traces 60A–60F. In this configuration, the lower and upper substrates 112, 114 and the rack 116 are nested together with the substrate 50. This allows the edge trace pads of the substrate to be positioned adjacent to corresponding pads formed on the adjacent surfaces of the substrates 112, 114, thereby facilitating wire bond connections, exemplary ones of which are shown in FIG. 5.

The rack 116, in a subassembly with the substrates 112, 114 and the circuits 50, with the edge plated side surfaces exposed and the circuits 110, is positioned in the housing 102. When the assembly is completed; z-axis dc and control signal routing is provided between top and bottom sides of the circuit assembly. The signal routing between pads formed on substrate surface 52B and the adjacent surface 112M of the top substrate 112 is shown in FIG. 5. For example, DC trace pads 112A–112F and 112G–112L are formed on surface 112M of the substrate 112, with the substrate surface 52B protruding through a window opening 112N formed in the substrate 112. Wire bonds 120 connect between corresponding ones of the trace pads of the substrate 112 and the trace pads of the substrate circuit 50.

The invention provides several advantages, including compact microwave packages resulting in size reductions of more than 50%, dc noise reduction using highly capacitive filtered lines, avoidance of dc wire jumping of RF signal traces, simple Z-axis interconnection, elimination of existing processes needed to install off the shelf dc routing products, significant weight reduction, and less expense than off the shelf filtering products.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A compact substrate circuit for carrying electrical control signals or DC power, the substrate circuit comprising:
   a dielectric substrate including upper and lower substrate surfaces and first and second side surfaces;
   a first ground plane layer formed on the upper substrate surface;
   a first thick film assembly formed on the first ground plane layer, comprising a first thin dielectric layer, a first set of thin conductive traces formed on the thin dielectric layer and onto the first and second side surfaces terminating in a first set of edge trace pads formed on the first side surface and a second set of edge trace pads formed on the second side surface, a second thin dielectric layer formed over the upper substrate surface covering the first set of traces such that the traces are sandwiched and shielded between adjacent first surfaces of the first and second dielectric layers; and
   a second ground plane formed on a second surface of the second dielectric layer, the first and second sets of trace pads exposed for connection to adjacent circuitry.

2. The substrate circuit of claim 1 further comprising:
   a third ground plane layer formed on the lower substrate surface;
   a second thick film assembly formed on the third ground plane layer, comprising a third thin dielectric layer, a second set of thin conductive traces formed on the third thin dielectric layer and onto the first and second side surfaces terminating in a third set of edge trace pads formed on the first side surface and a fourth set of edge trace pads formed on the second side surface, a fourth thin dielectric layer formed over the lower substrate surface covering the second set of traces such that the second set of traces are sandwiched and shielded between adjacent first surfaces of the third and fourth dielectric layers; and
   a fourth ground plane formed on a second surface of the fourth dielectric layer, the third and fourth sets of trace pads exposed for connection to adjacent circuitry.

3. The substrate circuit of claim 1 wherein the upper and lower surfaces of the dielectric substrate are planar, parallel surfaces.

4. The substrate circuit of claim 2 wherein the first and second side surfaces of the dielectric substrate are planar, parallel surfaces extending transversely with respect to the upper and lower surfaces of the dielectric substrate.

5. A microwave circuit assembly, comprising:
   first and second circuit board structures arranged in a separated configuration;
   a compact substrate circuit for carrying electrical control signals or DC power, the substrate circuit comprising a dielectric substrate including upper and lower substrate surfaces and first and second side surfaces, a first ground plane layer formed on the upper substrate surface, a first thick film assembly formed on the first ground plane layer, comprising a first thin dielectric layer, a first set of thin conductive traces formed on the thin dielectric layer and onto the first and second side surfaces terminating in a first set of edge trace pads formed on the first side surface and a second set of edge trace pads formed on the second side surface, a second thin dielectric layer formed over the upper substrate surface covering the first set of traces such that the traces are sandwiched and shielded between adjacent first surfaces of the first and second dielectric layers, and a second ground plane formed on a second surface of the second dielectric layer, the first and second sets of trace pads exposed for connection to said respective first and second circuit board structures;

the substrate circuit disposed between the first and second circuit board structures;

a first set of electrical connections between said first set of trace pads and said first circuit board structure; and a second set of electrical connections between said second set of trace pads and said second circuit board structure.

6. The microwave circuit assembly of claim 5 wherein the first circuit board structure includes a set of circuit trace pads, and a set of wire bond connections is provided between said set of circuit trace pads and said first set of edge trace pads.

7. The microwave circuit assembly of claim 5, wherein the compact substrate circuit further comprises:

a third ground plane layer formed on the lower substrate surface;

a second thick film assembly formed on the third ground plane layer, comprising a third thin dielectric layer, a second set of thin conductive traces formed on the third thin dielectric layer and onto the first and second side surfaces terminating in a third set of edge trace pads formed on the first side surface and a fourth set of edge trace pads formed on the second side surface, a fourth thin dielectric layer formed over the lower substrate surface covering the second set of traces such that the second set of traces are sandwiched and shielded between adjacent first surfaces of the third and fourth dielectric layers; and a fourth ground plane formed on a second surface of the fourth dielectric layer, the third and fourth sets of trace pads exposed for connection to the respective first and second circuit board structures.

8. The microwave circuit assembly of claim 5 wherein the first circuit board structure comprises a first planar circuit board, the second circuit board structure comprises a second planar circuit board, and said upper and lower surfaces of the dielectric substrate are planar, parallel surfaces.

9. The microwave circuit assembly of claim 8 wherein the first and second side surfaces of the dielectric substrate are planar, parallel surfaces extending transversely with respect to the upper and lower surfaces of the dielectric substrate.

10. The microwave circuit assembly of claim 5 wherein said first circuit board structure includes a first opening formed therein, said second circuit board structure includes a second opening formed therein, and said first side surface of the dielectric substrate extends into said first opening, and said second side surface of the dielectric substrate extends into said second opening.

11. The microwave circuit assembly of claim 10 further including a conductive rack structure having an opening formed therein to receive the compact substrate circuit.

* * * * *